United States Patent
Park et al.

(10) Patent No.: US 6,800,564 B2
(45) Date of Patent: Oct. 5, 2004

(54) ETCHING SOLUTION FOR SIGNAL WIRE AND METHOD OF FABRICATING THIN FILM TRANSISTOR ARRAY PANEL WITH THE SAME

(75) Inventors: Hong-Sick Park, Yongin (KR); Sung-Chul Kang, Seungnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/190,164

(22) Filed: Jul. 5, 2002

(65) Prior Publication Data

US 2003/0060056 A1 Mar. 27, 2003

(30) Foreign Application Priority Data

Jul. 6, 2001 (KR) ........................................ 2001-40310
Oct. 23, 2001 (KR) ........................................ 2001-65327

(51) Int. Cl.[7] ...................... H01L 21/302; H01L 21/461
(52) U.S. Cl. ...................................... 438/745; 438/754
(58) Field of Search ................................ 438/745, 754, 438/669, 672, 689, 612–614, 650, 686, 23, 29, 30, 280, 287, 673, 764–781, 587, 623, 27, 28, 34, 116, 365, 482, 592, 40, 158, 164; 252/79.1, 79.4; 148/243, 248, 246, 252, 253, 254; 257/84, 95, 98, 741, 762, 772, 29, 347, 350, 765

(56) References Cited

U.S. PATENT DOCUMENTS 4,455,364 A * 6/1984 Sasa ........................... 430/299
6,486,108 B1 * 11/2002 Yates et al. ................. 510/175
2003/0071309 A1 * 4/2003 Yamanaka et al. .......... 257/350

* cited by examiner

Primary Examiner—W. David Coleman
(74) Attorney, Agent, or Firm—F. Chau & Associates, LLC

(57) ABSTRACT

In a method of fabricating a TFT array substrate, a gate wire is formed on an insulating substrate. The gate wire has gate lines, gate electrodes, and gate pads connected to the gate lines. A gate insulating layer and a semiconductor layer are formed in sequence. A data wire is formed, which includes data lines intersecting the gate lines, source electrodes connected to the data lines and placed close to the gate electrodes, drain electrodes opposite the source electrodes with respect to the gate electrodes, and data pads connected to the data lines. A protective layer is deposited, and is patterned to form contact holes exposing at least the drain electrodes. A silver or silver alloy conductive layer is deposited on the protective layer. The conductive layer is patterned using an etching solution with phosphoric acid, nitric acid, acetic acid, potassium peroxymonosulphate and ultra-pure water or an etching solution with nitric acid, acetic acid, phosphoric acid, ethylene glycol and ultra-pure water to thereby form a reflecting layer. The reflecting layer is connected to the drain electrodes through the contact holes.

12 Claims, 20 Drawing Sheets

| Composition of etching solution | | | | Division | Etching rate | | | | | | | | | |
|---|---|---|---|---|---|---|---|---|---|---|---|---|---|---|
| Phosphoric acid | Nitric acid | Phosphoric acid | Ethylene glycol | Evaluation | 1st | 2nd | 3rd | 4th | 5th | 6th | 7th | 8th | 9th | 10th |
| 10 | 11 | 30 | 3 | Etching rate (Å/second) | 18.1 | 17.6 | 18.2 | 18.0 | 18.3 | 18.1 | 17.9 | 18.2 | 18.3 | 17.8 |
| Phosphoric acid | Nitric acid | Phosphoric acid | Ethylene glycol | Phosphoric acid (X Value, %) | 3 | 5 | 7 | 10 | 15 | 20 | 30 | 40 | 50 | 60 |
| X | 11 | 30 | 3 | Etching rate (Å/second) | 11.2 | 13.4 | 14.5 | 18.0 | 19.2 | 19.8 | 20.1 | 23.0 | 27.5 | 32.8 |
| Phosphoric acid | Nitric acid | Phosphoric acid | Ethylene glycol | Nitric acid (X Value, %) | 1 | 3 | 5 | 7 | 9 | 11 | 13 | 15 | 18 | 20 |
| 10 | X | 30 | 3 | Etching rate (Å/second) | 10.0 | 12.5 | 14.9 | 16.1 | 17.6 | 18.1 | 19.1 | 20.3 | 22.3 | 24.8 |
| Phosphoric acid | Nitric acid | Phosphoric acid | Ethylene glycol | Acetic acid (X Value, %) | 3 | 5 | 7 | 10 | 15 | 20 | 30 | 40 | 50 | 60 |
| 10 | 11 | X | 3 | Etching rate (Å/second) | 11.2 | 13.4 | 14.5 | 15.0 | 15.8 | 17.0 | 18.1 | 23.5 | 28.9 | 34.8 |
| Phosphoric acid | Nitric acid | Phosphoric acid | Ethylene glycol | Etching rate (X Value, %) | 0.1 | 0.5 | 1 | 1.5 | 2 | 3 | 5 | 10 | 15 | 20 |
| 10 | 11 | 30 | X | Etching rate (Å/second) | 4.3 | 11.5 | 14.9 | 16.1 | 17.6 | 18.0 | 18.8 | 19.9 | 23.4 | 30.3 |

FIG.2

| Composition of etching solution | | | | Division | | Etching rate | | | | | | | | | |
|---|---|---|---|---|---|---|---|---|---|---|---|---|---|---|---|
| Phosphoric acid | Nitric acid | Phosphoric acid | Ethylene glycol | Evaluation | 1st | 2nd | 3rd | 4th | 5th | 6th | 7th | 8th | 9th | 10th |
| 10 | 11 | 30 | 3 | Etching rate (Å/second) | 18.1 | 17.6 | 18.2 | 18.0 | 18.3 | 18.1 | 17.9 | 18.2 | 18.3 | 17.8 |
| 10 | 11 | 30 | 3 | Phosphoric acid (X Value, %) | 3 | 5 | 7 | 10 | 15 | 20 | 30 | 40 | 50 | 60 |
| X | 11 | 30 | 3 | Etching rate (Å/second) | 11.2 | 13.4 | 14.5 | 18.0 | 19.2 | 19.8 | 20.1 | 23.0 | 27.5 | 32.8 |
| 10 | 11 | 30 | 3 | Nitric acid (X Value, %) | 1 | 3 | 5 | 7 | 9 | 11 | 13 | 15 | 18 | 20 |
| 10 | X | 30 | 3 | Etching rate (Å/second) | 10.0 | 12.5 | 14.9 | 16.1 | 17.6 | 18.1 | 19.1 | 20.3 | 22.3 | 24.8 |
| 10 | 11 | 30 | 3 | Acetic acid (X Value, %) | 3 | 5 | 7 | 10 | 15 | 20 | 30 | 40 | 50 | 60 |
| 10 | 11 | X | 3 | Etching rate (Å/second) | 0.1 | 0.5 | 1 | 1.5 | 2 | 3 | 5 | 10 | 15 | 20 |
| 10 | 11 | 30 | 3 | Etching rate (X Value, %) | 11.2 | 13.4 | 14.5 | 15.0 | 15.8 | 17.0 | 18.1 | 23.5 | 28.9 | 34.8 |
| 10 | 11 | 30 | X | Etching rate (Å/second) | 4.3 | 11.5 | 14.9 | 16.1 | 17.6 | 18.0 | 18.8 | 19.9 | 23.4 | 30.3 |

FIG. 3

| Composition of etching solution | | | | Division | Taper angle (°) | | | | | | | | | |
|---|---|---|---|---|---|---|---|---|---|---|---|---|---|---|
| Phosphoric acid | Nitric acid | Phosphoric acid | Ethylene glycol | Evaluation | 1st | 2nd | 3rd | 4th | 5th | 6th | 7th | 8th | 9th | 10th |
| 10 | 11 | 30 | 3 | Laser angle (°) | 45 | 44 | 45 | 46 | 45 | 46 | 47 | 44 | 44 | 45 |
| X | 11 | 30 | 3 | Phosphoric acid (X Value, %) | 3 | 5 | 7 | 10 | 15 | 20 | 30 | 40 | 50 | 60 |
| | | | | Taper angle (°) | 29 | 31 | 36 | 45 | 56 | 69 | 79 | 83 | 87 | 89 |
| 10 | X | 30 | 3 | Nitric acid (X Value, %) | 1 | 3 | 5 | 7 | 9 | 11 | 13 | 15 | 18 | 20 |
| | | | | Taper angle (°) | 21 | 26 | 31 | 36 | 41 | 45 | 48 | 53 | 59 | 64 |
| 10 | 11 | X | 3 | Acetic acid (X Value, %) | 3 | 5 | 7 | 10 | 15 | 20 | 30 | 40 | 50 | 60 |
| | | | | Taper angle (°) | 18 | 22 | 26 | 30 | 34 | 39 | 45 | 52 | 61 | 73 |
| 10 | 11 | 30 | X | Ethylene glycol (X Value, %) | 0.1 | 0.5 | 1 | 1.5 | 2 | 3 | 5 | 10 | 15 | 20 |
| | | | | Taper angle (°) | 88 | 75 | 63 | 58 | 52 | 45 | 38 | 31 | 28 | 23 |

FIG. 4

| Composition of etching solution | | | | Division | Critical dimension | | | | | | | | | |
|---|---|---|---|---|---|---|---|---|---|---|---|---|---|---|
| Phosphoric acid | Nitric acid | Phosphoric acid | Ethylene glycol | Evaluation | 1st | 2nd | 3rd | 4th | 5th | 6th | 7th | 8th | 9th | 10th |
| 10 | 11 | 30 | Ethylene glycol 3 | Critical dimension (μm) | 0.9 | 1.0 | 0.9 | 0.9 | 1.0 | 1.0 | 1.0 | 0.9 | 0.9 | 1.0 |
| X | 11 | 30 | Ethylene glycol 3 | Phosphoric acid (X Value, %) | 3 | 5 | 7 | 10 | 15 | 20 | 30 | 40 | 50 | 60 |
| 10 | 11 | 30 | Ethylene glycol 3 | Critical dimension (μm) | 0.7 | 0.7 | 0.8 | 0.9 | 0.9 | 1.0 | 1.0 | 1.1 | 1.2 | 1.4 |
| 10 | X | 30 | Ethylene glycol 3 | Nitric acid (X Value, %) | 1 | 3 | 5 | 7 | 9 | 11 | 13 | 15 | 18 | 20 |
| 10 | 11 | 30 | Ethylene glycol 3 | Critical dimension (μm) | 0.5 | 0.5 | 0.6 | 0.7 | 0.8 | 0.9 | 0.9 | 1.0 | 1.1 | 1.1 |
| 10 | 11 | X | Ethylene glycol 3 | Acetic acid (X Value, %) | 3 | 5 | 7 | 10 | 15 | 20 | 30 | 40 | 50 | 60 |
| 10 | 11 | 30 | Ethylene glycol 3 | Critical dimension (μm) | 0.1 | 0.1 | 0.2 | 0.3 | 0.5 | 0.7 | 0.9 | 23.5 | 28.9 | 34.8 |
| 10 | 11 | 30 | Ethylene glycol X | Ethylene glycol (X Value, %) | 0.1 | 0.5 | 1 | 1.5 | 2 | 3 | 5 | 10 | 15 | 20 |
| 10 | 11 | 30 | Ethylene glycol 3 | Critical dimension (μm) | 0.6 | 0.6 | 0.7 | 0.7 | 0.8 | 0.9 | 1.0 | 1.0 | 1.1 | 1.2 |

FIG.6

| Composition of etching solution | Evaluation | ① | ② | ③ | ④ | ⑤ | ⑥ | ⑦ | ⑧ | ⑨ | Uniformity (%) |
|---|---|---|---|---|---|---|---|---|---|---|---|
| Phosphoric acid:10% | 1st | 0.91 | 0.93 | 0.90 | 0.91 | 0.92 | 0.90 | 0.91 | 0.92 | 0.90 | 1.65 |
| Nitric acid:11% | 2nd | 0.95 | 0.93 | 0.94 | 0.95 | 0.94 | 0.95 | 0.95 | 0.94 | 0.94 | 1.06 |
| Acetic acid:30% | 3rd | 0.90 | 0.92 | 0.91 | 0.91 | 0.92 | 0.91 | 0.90 | 0.92 | 0.91 | 1.08 |
| Ethylene glycol:3% | 4th | 0.91 | 0.93 | 0.94 | 0.95 | 0.94 | 0.93 | 0.94 | 0.93 | 0.94 | 2.15 |

|   | Width of thin film(μm) | Distance between thin films(μm) | |
|---|---|---|---|
|   |   | Horizontal | Vertical |
| 1 | 9.492 | 5.104 | 4.978 |
| 2 | 9.296 | 5.104 | 5.156 |
| 3 | 9.419 | 5.000 | 5.156 |
| 4 | 9.453 | 5.048 | 5.107 |
| 5 | 9.375 | 5.260 | 5.378 |
| 6 | 9.570 | 5.052 | 5.111 |
| 7 | 9.531 | 5.260 | 5.244 |
| 8 | 9.375 | 5.260 | 5.289 |
| 9 | 9.648 | 5.000 | 5.067 |

ETCHING SOLUTION FOR SIGNAL WIRE AND METHOD OF FABRICATING THIN FILM TRANSISTOR ARRAY PANEL WITH THE SAME

BACKGROUND OF THE INVENTION (a) Field of the Invention

The present invention relates to an etching solution for a signal wire, and a method of fabricating a TFT array panel with the same.

(b) Description of the Related Art

Generally, a signal wire for a semiconductor device or a display device is used as a medium for signal transmission and hence, it is required to prevent the signal wire from causing any delay in the signal transmission.

For that purpose, the signal wire may be formed of a low resistivity conductive material such as silver (Ag), which exhibits the lowest resistivity. However, when using silver or silver alloy, it is difficult to pattern the target layer by way of photolithography based on a mask.

Meanwhile, a liquid crystal display ("LCD"), one of the most extensively used flat panel displays, has two panels with electrodes, and a liquid crystal layer interposed therebetween. Voltages are applied to the electrodes so that the liquid crystal molecules in the liquid crystal layer are re-oriented to thereby control the light transmittance.

The most prevalent one of the LCDs is one having two panels respectively having the electrodes and thin film transistors ("TFTs") for switching the voltages applied to the electrodes. The TFTs are provided on one of the panels, called a "TFT array panel".

The LCD is classified into a transmissive type displaying images by transmitting light from a specific light source such as a backlight through a transmitting layer such as a transparent conductive material-based pixel electrode made of, and a reflective type displaying images by reflecting ambient light such as natural light with a reflecting layer such as a reflective conductive material-based pixel electrode.

The reflective type LCD has lower power consumption since it does not use a separate light source, while shows relatively poor image quality since it displays the image only using the light reflected by the reflecting layer. In order to improve the poor image quality, it is preferable that the reflecting layer is made of a material with high reflectance such as silver, silver alloy, aluminum, and aluminum alloy.

However, even though the silver or silver alloy has a reflectance about 15% higher compared with the aluminum or aluminum alloy to improve the visibility, it is difficult to pattern such a layer through the usual photolithography process. Therefore, the silver-based layer may not be used as a reflecting layer.

SUMMARY OF THE INVENTION

It is an object of the present invention to provide an etching solution adapted for finely patterning a signal wire, and a method of forming a signal wire using the etching solution.

It is another object of the present invention to provide a method of fabricating a TFT array panel for a reflective type LCD with a well-patterned reflecting layer.

In the process of fabricating a signal wire and a TFT array panel with a signal wire according to the present invention, a silver or silver alloy conductive layer is patterned using an etching solution containing phosphoric acid, nitric acid, acetic acid and potassium peroxymonosulphate ("oxone"), or an etching solution containing phosphoric acid, nitric acid, acetic acid and ethylene glycol.

It is preferable that the etching solution contains phosphoric acid of 40–60%, nitric acid of 1–10%, acetic acid of 5–15%, and potassium peroxymonosulphate of 1–5%, or contains phosphoric acid of 10–30%, nitric acid of 5–15%, acetic acid of 10–30%, and ethylene glycol of 1–10%. The silver alloy contains silver for a basic material, and alloy contents of 0.01–20 atomic % such as Pd, Cu, Mg, Al, Li, Pu, Np, Ce, Eu, Pr, Ca, La, Nb, Nd and Sm. The silver alloy may contain two elements or three elements with one or two of the alloy contents.

Such an etching solution and a fabricating method using such an etching solution may be adapted for a method of fabricating a TFT array panel.

In a method of fabricating a TFT array panel according to the present invention, a gate wire is formed on an insulating substrate. The gate wire has a plurality of gate lines, and a plurality of gate electrodes connected to the gate lines. A gate insulating layer and a semiconductor layer is deposited in sequence, and a data wire is formed thereafter. The data wire has a plurality of data lines intersecting the gate lines, a plurality of source electrodes connected to the data lines and placed close to the gate electrodes, and a plurality of drain electrodes facing the source electrodes around the gate electrodes. A protective layer is deposited and patterned to form a plurality of first contact holes exposing the drain electrodes. A silver or silver alloy conductive layer is deposited on the protective layer. The conductive layer is patterned using an etching solution with phosphoric acid, nitric acid, acetic acid, potassium peroxymonosulphate and ultra-pure water or an etching solution with nitric acid, acetic acid, phosphoric acid, ethylene glycol and ultra-pure water to thereby form a reflecting layer. The reflecting layer is connected to the drain electrodes through the first contact holes.

The thickness of the conductive layer is preferably in the range of 1,000–3,000 Å, or in the range of 300–600 Å. It is preferable that the protective layer is made of a photosensitive organic material.

The gate wire may further include a plurality of gate pads for receiving scanning signals from an external source and transmitting the scanning signals to the gate lines. The data wire may further include a plurality of data pads for receiving image signals from the outside and transmitting the image signals to the data lines. The protective layer may have a plurality of second and third contact holes respectively exposing the data pads and the gate pads together with the gate insulating layer. A plurality of subsidiary gate and data pads made of the same layer as the reflecting layer may be further formed, and the subsidiary gate and data pads are electrically connected to the gate and the data pads through the second and the third contact holes, respectively.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 2 is a table illustrating the etching rate of the silver alloy signal wire as a function of the compositions of the etching solution in a method of forming a signal wire according to an embodiment of the present invention;

FIG. 3 is a table illustrating the tape angle of the silver alloy signal wire as a function of the compositions of the etching solution in a method of forming a signal wire according to an embodiment of the present invention;

FIG. 4 is a table illustrating the critical dimension of the silver alloy signal wire as a function of the compositions of the etching solution in a method of forming a signal wire according to an embodiment of the present invention;

FIG. 6 is a table illustrating the uniformity in the critical dimension of the silver alloy wire as a function of the compositions of the etching solution in a method of forming a signal wire according to an embodiment of the present invention;

DETAILED DESCRIPTION OF THE PREFERRED EMBODIMENTS

Figure 1:
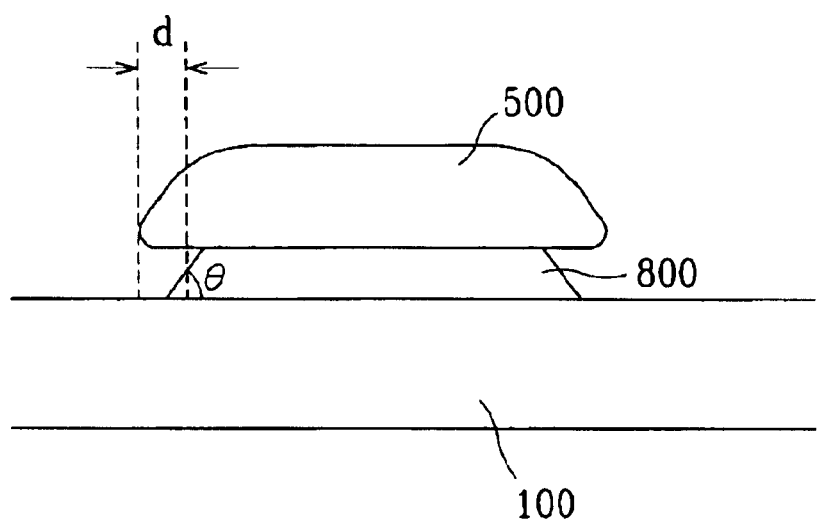
FIG. 1 is a sectional view illustrating a method of forming a signal wire according to an embodiment of the present invention.

The present invention now will be described more fully hereinafter with reference to the accompanying drawings, in which preferred embodiments of the inventions invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Methods of fabricating a signal wire and a TFT array panel according to embodiments of the present invention will be described in detail with reference to the accompanying drawings.

FIG. 1 is a sectional view illustrating a method of forming a signal wire according to an embodiment of the present invention.

As shown in FIG. 1, a signal wire 800 of a semiconductor device or a display device is formed by depositing a thin film including a low-resistivity conductive material such as silver and silver alloy on a substrate 100, and patterning the thin film using a photoresist pattern 500 as an etching mask.

The conditions for making the patterning of the silver or silver alloy-based signal wire 800 in an appropriate manner are preferably established such that the etching rate thereof is 50 Å/sec or less, the tapering angle θ is 90 degrees or less, the critical dimension 2×d of the width difference between the signal wire 800 and the photoresist pattern 500 is 1.0 microns or less, the uniformity in the critical dimension is 5% or less, and the residue is not left over.

For this purpose, the signal wire 800 is patterned through wet etching, using an etching solution containing phosphoric acid of 10–30%, nitric acid of 5–15%, acetic acid of 10–30%, ethylene glycol of 1–10%, and ultra-pure water of 15–75%, or an etching solution containing phosphoric acid of 40–60%, nitric acid of 1–10%, acetic acid of 5–15%, potassium peroxymonosulphate of 1–5%, and ultra-pure water of the remaining percent range. When forming the signal wire 800 of silver alloy, the target contains Ag for a base material, and alloy contents of 0.01–20 atomic %, such as Pd, Cu, Mg, Al, Li, Pu, Np, Ce, Eu, Pr, Ca, La, Nb, Nd and Sm. The silver alloy may contain two elements or three elements with one or two alloy contents.

In an experiment, a pure silver film with the thickness of about 2,000 Å was deposited and patterned using an etching solution containing phosphoric acid of about 50%, nitric acid of about 5%, acetic acid of about 10%, and potassium peroxymonosulphate of about 1–3%. The etching rate of the layer was measured to be about 40 Å/sec, the taper angle θ to be about 70–80 degrees, the critical dimension to be about 1.2–1.4 microns, and the uniformity in the critical dimension to be about 3–4%, and no residue was left over.

In another experiment, a thin film of silver alloy of Ag—Pd—Cu with the thickness of about 1500 Å was deposited and patterned using an etching solution containing phosphoric acid, nitric acid, acetic acid and ethylene glycol. The etching rate was measured to be about 15–20 Å/sec, the taper angle θ to be about 30–80°, the critical dimension to be about 0.1–1.0 microns, and the uniformity in the critical dimension to be about 1–4%, and no residue was left over. This will be now explained in detail with reference to the figures.

Figure 5:
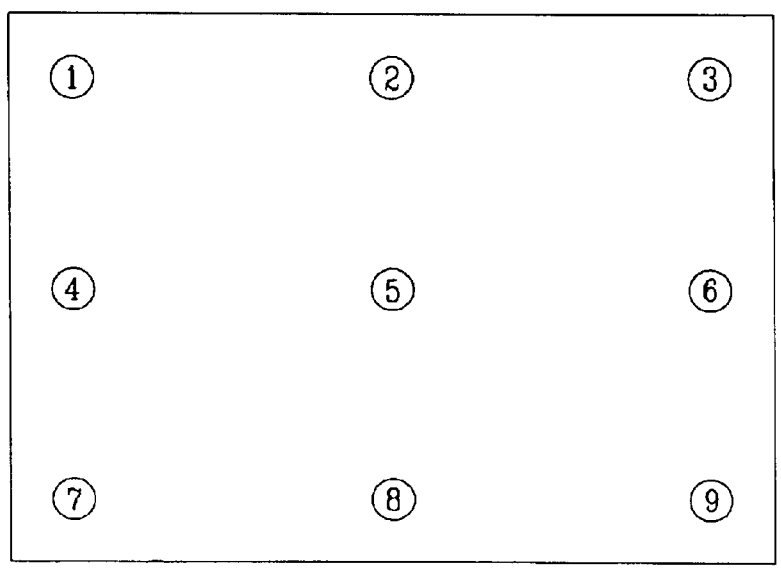
FIG. 5 illustrates the positions of measuring the critical dimension of the silver alloy signal wire in a method of forming a signal wire according to an embodiment of the present invention.

FIG. 2 is a table illustrating the etching rate of the silver alloy signal wire as a function of the compositions of the etching solution in a method of forming a signal wire according to an embodiment of the present invention, FIG. 3 is a table illustrating the tape angle of the silver alloy signal wire as a function of the compositions of the etching solution in a method of forming a signal wire according to an embodiment of the present invention, and FIG. 4 is a table illustrating the critical dimension of the silver alloy signal wire as a function of the compositions of the etching solution in a method of forming a signal wire according to an embodiment of the present invention. FIG. 5 is a table illustrating the uniformity in the critical dimension of the silver alloy wire as a function of the compositions of the etching solution in a method of forming a signal wire according to an embodiment of the present invention, and FIG. 6 illustrates the positions of measuring the critical dimension of the silver alloy signal wire in a method of forming a signal wire according to an embodiment of the present invention.

Initially, the etching rate, the taper angle and the critical dimension of the silver alloy signal wire were measured ten times with the use of an etching solution containing phosphoric acid of about 10%, nitric acid of about 11%, acetic acid of about 30% and ethylene glycol of about 3%. The measurement was then made while changing the content of phosphoric acid in the range of 3–60%, the content of nitric acid in the range of 1–20%, the content of acetic acid in the range of 3–60%, and the content of ethylene glycol in the range of 0.1–20%, respectively. In the tables of FIGS. 2 to 4, X indicates the content of phosphoric acid, nitric acid, acetic acid and ethylene glycol as variables, respectively.

In the meantime, a thin film of Ag—Pd—Cu alloy was deposited on a substrate with a size of about 300 mm×400 mm, and patterned using an etching solution containing phosphoric acid of about 10%, nitric acid of about 11%, acetic acid of about 30% and ethylene glycol of about 3% to thereby form a reflecting layer of about 2.04". The critical dimension of the target layer was measured four times at the nine positions shown in FIG. 6.

As indicated in FIG. 2 with a bold line, when using the etching solution containing phosphoric acid of about 10%, nitric acid of about 11%, acetic acid of about 30% and ethylene glycol of about 3%, the etching rate was measured to be in the favorable range of about 17.6–18.4 Å/sec. Furthermore, when changing the content of phosphoric acid in the range of about 10–30%, the content of nitric acid in the range of about 5–15%, the content of acetic acid in the range of about 10–30%, and the content of ethylene glycol in the range of about 1–10%, the etching rate was measured to be in the favorable range of about 14.9–20.3 Å/sec.

As indicated in FIG. 3 with a bold line, when using the etching solution containing phosphoric acid of about 10%, nitric acid of about 11%, acetic acid of about 30% and ethylene glycol of about 3%, the taper angle was measured to be in the favorable range of about 45–79 degrees. Furthermore, when varying the content of phosphoric acid in the range of about 10–30%, the content of nitric acid in the range of about 5–15%, the content of acetic acid in the range of about 10–30%, and the content of ethylene glycol in the range of about 1–10%, the taper angle was measured to be in the favorable range of about 31–63 degrees.

As indicated in FIG. 4 with a bold line, when using the etching solution containing phosphoric acid of about 10%, nitric acid of about 11%, acetic acid of about 30% and ethylene glycol of about 3%, the critical dimension was measured to be in the favorable range of about 0.9–1.0 microns. Furthermore, when varying the content of phosphoric acid in the range of about 10–30%, the content of nitric acid in the range of about 5–15%, the content of acetic acid in the range of about 10–30%, and the content of ethylene glycol in the range of about 1–10%, the critical dimension was measured to be in the favorable range of about 0.3–1.0 microns.

Furthermore, as shown in FIGS. 5 and 6, when measuring the critical dimension at nine positions, the uniformity in the critical dimension turned out to be in the favorable range of about 1.65–2.15%.

Meanwhile, when patterning the silver alloy film using an aluminum etchant containing only phosphoric acid, nitric acid and acetic acid, the etching rate was measured to be 500 Å/sec, which is too high to control the patterning degree. Furthermore, the etching was in part made non-uniformly. As a result, the silver alloy film was not well patterned by using the aluminum etchant.

The above-described method of forming a signal wire may be adapted for fabricating a TFT array panel for an LCD.

Figure 7:
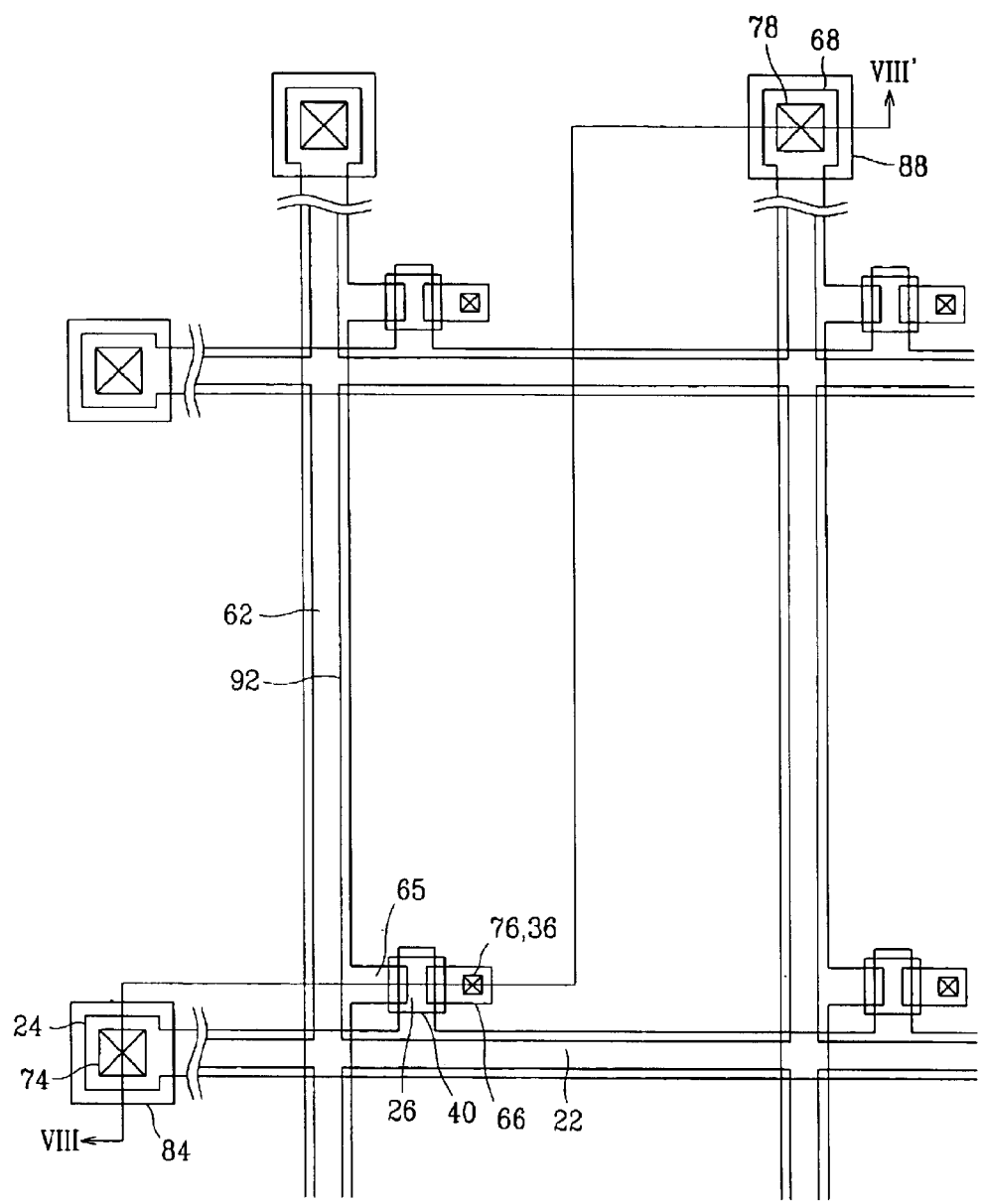
FIG. 7 is a layout view of a TFT array panel for a reflective type LCD fabricated by a method of fabricating a TFT array panel according to an embodiment of the present invention.
Figure 8:
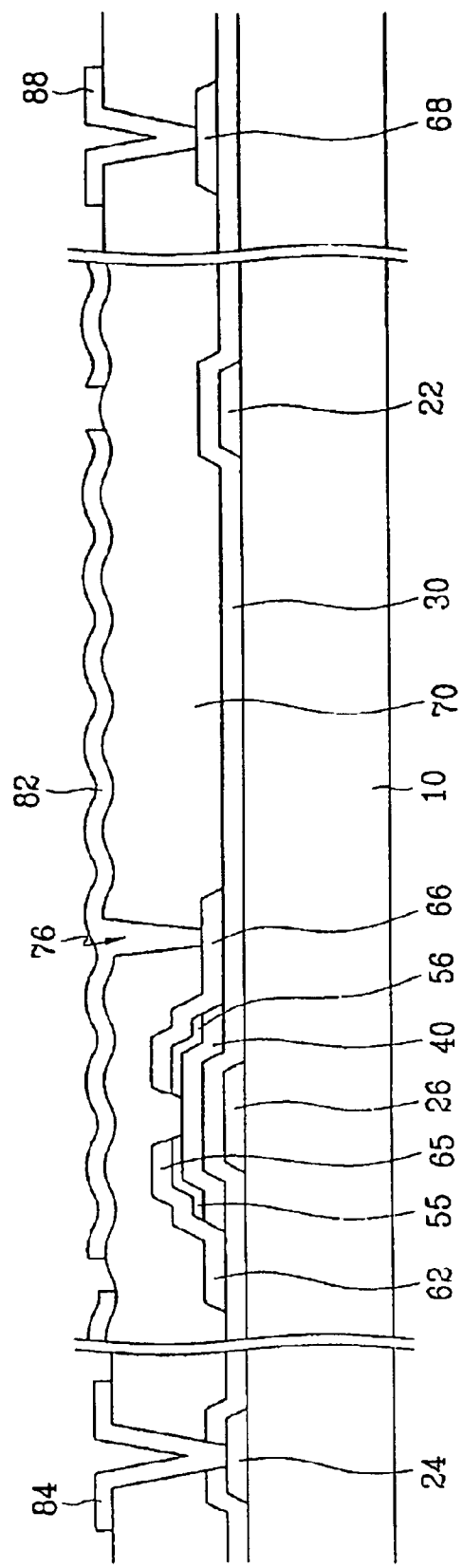
FIG. 8 is a sectional view of the TFT array panel shown in FIG. 7 taken along the line VIII–VIII'.

FIG. 7 is a layout view of a TFT array panel for a reflective type LCD, and FIG. 8 is a sectional view of the TFT array panel shown in FIG. 7 taken along the line VIII–VIII'.

A gate wire with a low resistivity material such as silver, silver alloy, aluminum and aluminum alloy is formed on an insulating substrate 10. The gate wire may bear a single-layered structure, or a multiple-layered structure. The gate wire includes a plurality of gate lines 22 extending in a horizontal direction, a plurality of gate pads 24 connected to ends of the gate lines 22 to receive gate signals from an external source and to transmit them to the gate lines 22, and a plurality of gate electrodes 26 of TFTs connected to the gate lines 22. The gate wire may further include storage electrodes, which receive common electrode voltages ("common voltages") applied to a common electrode of another panel from an external source. The storage electrode overlaps a reflecting layer 82 to be described later, thereby forming a storage capacitor for enhancing the electric charge storing capacity of pixels.

A gate insulating layer 30 covering the gate wire 22, 24 and 26 is formed on the substrate 10 and the gate insulating layer 30 is preferably made of silicon nitride (SiNx).

A semiconductor layer 40 preferably made of amorphous silicon is formed on the gate insulating layer 30 opposite the gate electrodes 26. An ohmic contact layer 55 and 56 preferably made of silicide or n+ hydrogenated amorphous silicon heavily doped with n-type impurities is formed on the semiconductor layer 40.

A data wire preferably made of a low resistivity conductive material such as aluminum or silver is formed on the ohmic contact layer 55 and 56 and the gate insulating layer 30. The data wire includes a plurality of data lines 62 intersecting the gate lines 22 to define pixel areas, a plurality of source electrodes 65 connected to the data lines 62 and extending one portions 55 of the ohmic contact layer, a plurality of data pads 68 connected to one ends of the data lines 62 to receive picture signals from an external source, and a plurality of drain electrodes 66 separated from the source electrodes 65 and located on the other portions 56 of the ohmic contact layer opposite to the source electrodes 65 with respect to the gate electrodes 26.

A protective layer 70 preferably made of a photosensitive organic material exhibiting excellent flattening characteristic is formed on the data wire 62, 65, 66 and 68 and portions of the semiconductor layer 40 which are not covered by the data wire. The protective layer 70 bears an unevenness pattern to maximize the reflection efficiency of a reflecting layer 82 to be formed later. The protective layer 70 may further include an insulating layer made of silicon nitride.

The protective layer 70 has a plurality of contact holes 76 and 78 exposing the drain electrodes 66 and the data pads 68, respectively, and a plurality of contact holes 74 exposing the gate pads 24 together with the gate insulating layer 30.

A plurality of reflecting layers 82 preferably made of silver or silver alloy are formed on the protective layer 70. Each reflecting layer 82 is located at a pixel area and electrically connected to the associated drain electrode 66 through the contact hole 76. For the reflecting layer 82 of silver alloy, it contains Ag for a base material, and alloy contents of 0.01–20 atomic % or less, such as Pd, Cu, Mg, Al, Li, Pu, Np, Ce, Eu, Pr, Ca, La, Nb, Nd and Sm. The silver alloy layer may have two elements or three elements with one or two alloy contents. A plurality of subsidiary gate pads 84 and a plurality of subsidiary data pads 88 are formed on the protective layer 70. The subsidiary gate and data pads 84 and 88 are connected to the gate and the data pads 24 and 68 through the contact holes 74 and 78, respectively. The subsidiary gate and data pads 84 and 88 are introduced to protect the gate and the data pads 24 and 68, but may be omitted.

A method of fabricating a TFT array panel according to an embodiment of the present invention will be now described in detail with reference to FIGS. 9A to 12B as well as FIGS. 7 and 8.

Figure 9A:
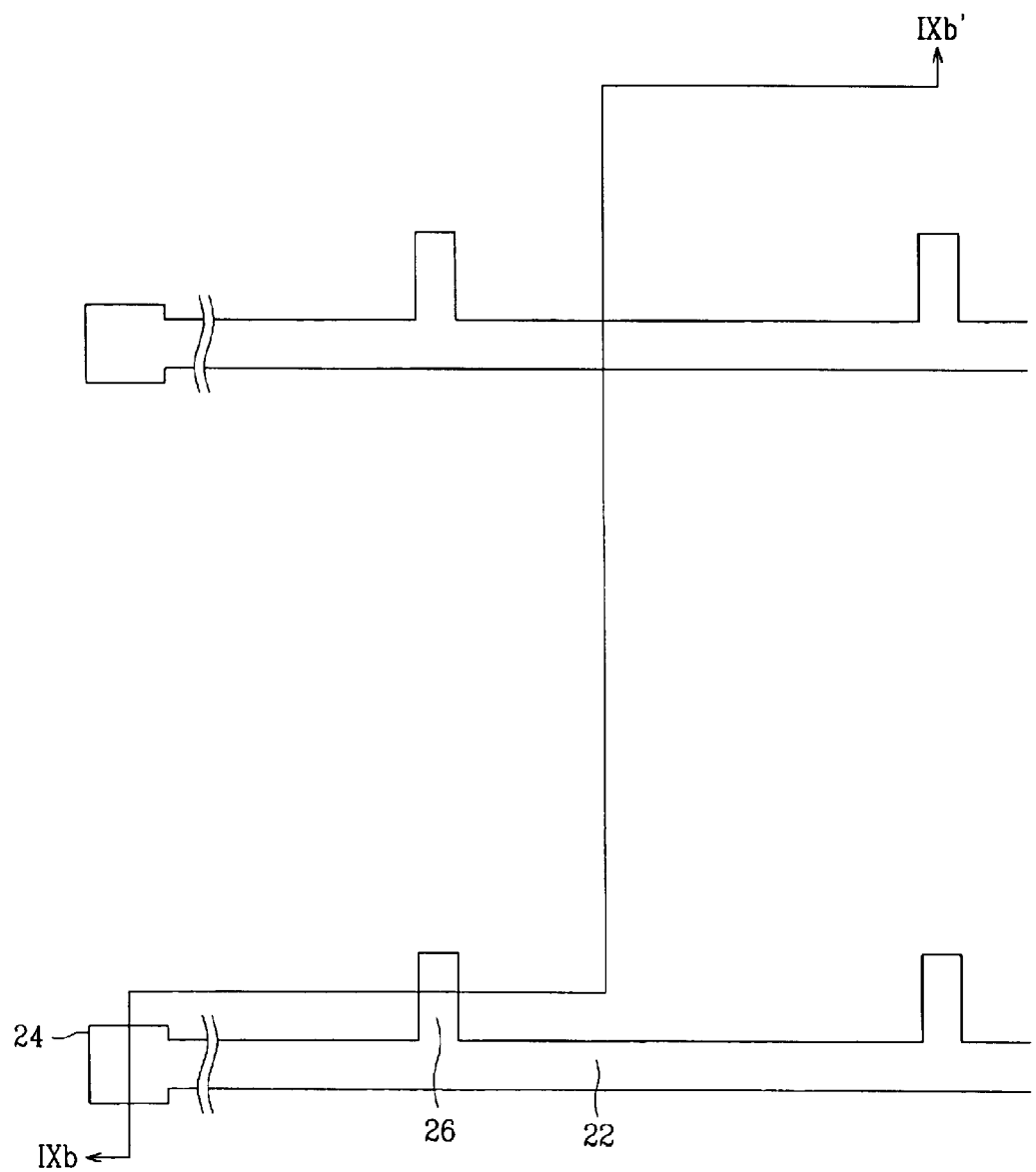
FIGS. 9A, 10A, 11A and 12A are layout view of a TFT array panel for a transflective LCD in intermediate steps of a fabricating method thereof according to an embodiment of the present invention.
Figure 9B:
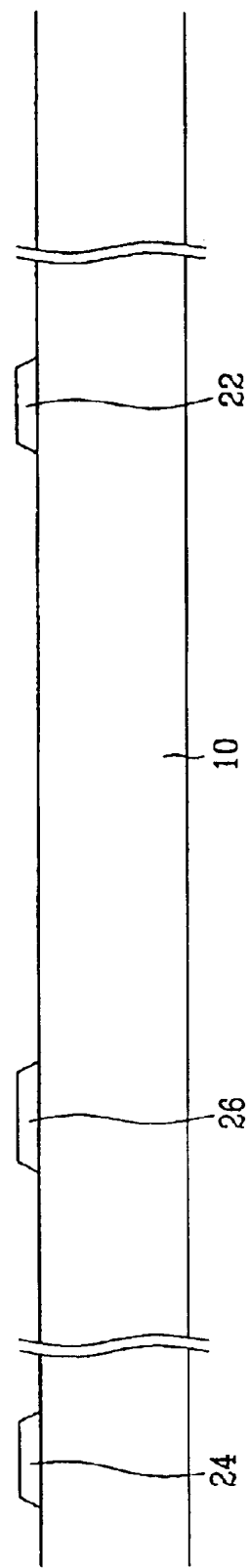
FIG. 9B is a sectional view of the TFT array panel shown in FIG. 9A taken along the line IXB–IXB'.

First, as shown in FIGS. 9A and 9B, a layer based on a low resistivity conductive material is deposited on a glass substrate 10, and patterned through photolithography based on a mask to thereby form a gate wire extending substantially in a horizontal direction. The gate wire includes a plurality of gate lines 22, a plurality of gate electrodes 26, and a plurality of gate pads 24.

Figure 10A:
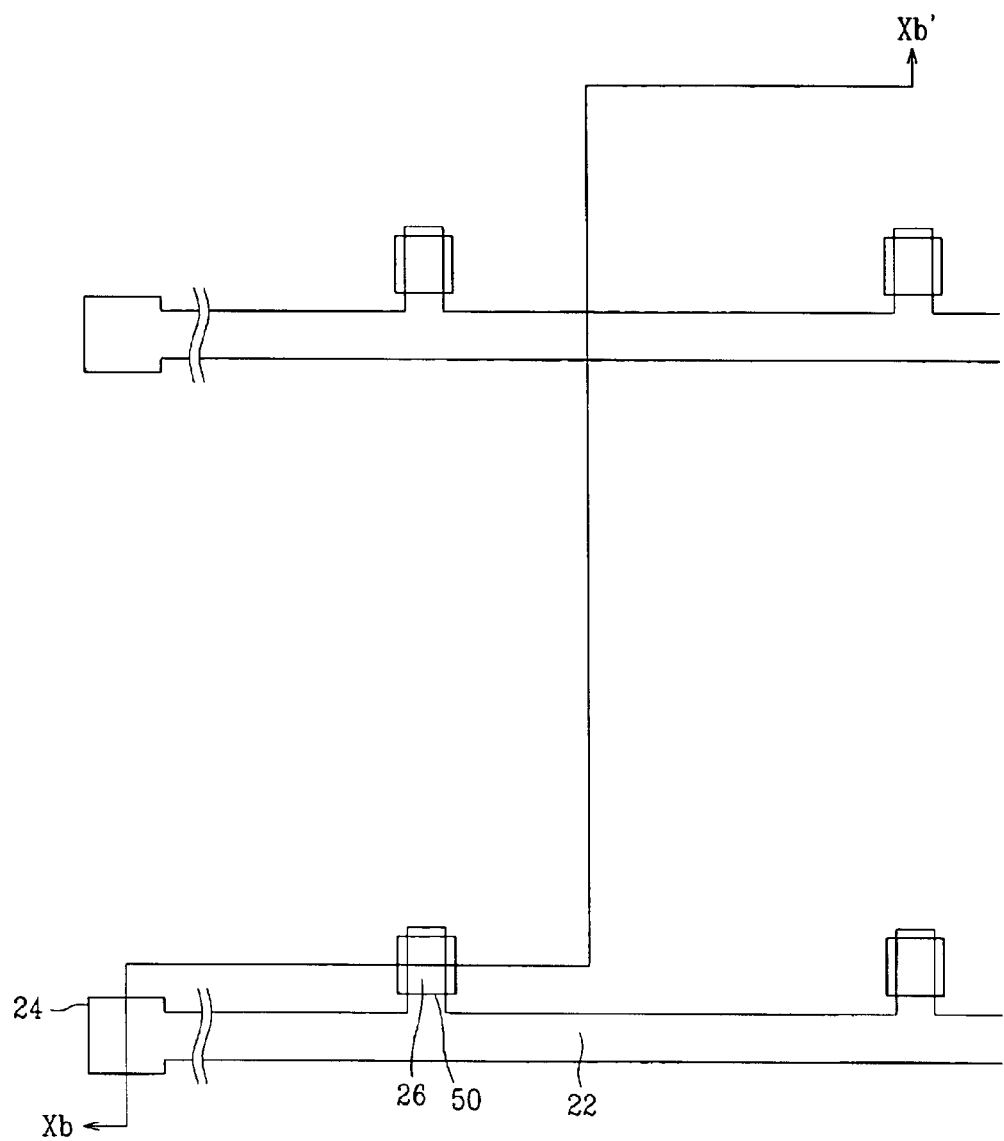
Figure 10B:
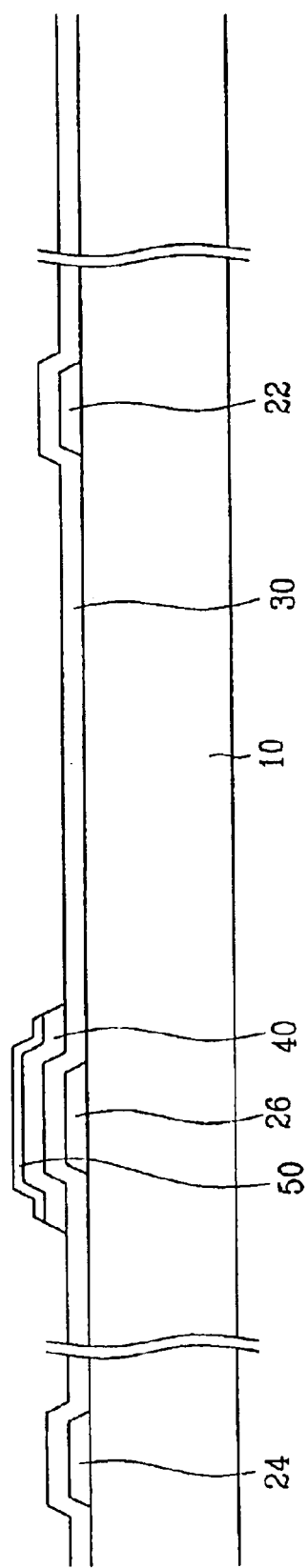
FIG. 10B is a sectional view of the TFT array panel shown in FIG. 10A taken along the line XB–XB'.

Thereafter, as shown in FIGS. 10A and 10B, a silicon nitride gate insulating layer 30, a semiconductor layer 40 made of amorphous silicon and a doped amorphous silicon layer 50 are sequentially deposited on the substrate 10, and the semiconductor layer 40 and the doped amorphous silicon layer 50 are patterned to thereby form a semiconductor layer 40 and an ohmic contact layer 50 on the gate insulating layer 30 opposite the gate electrodes 24.

Figure 11A:
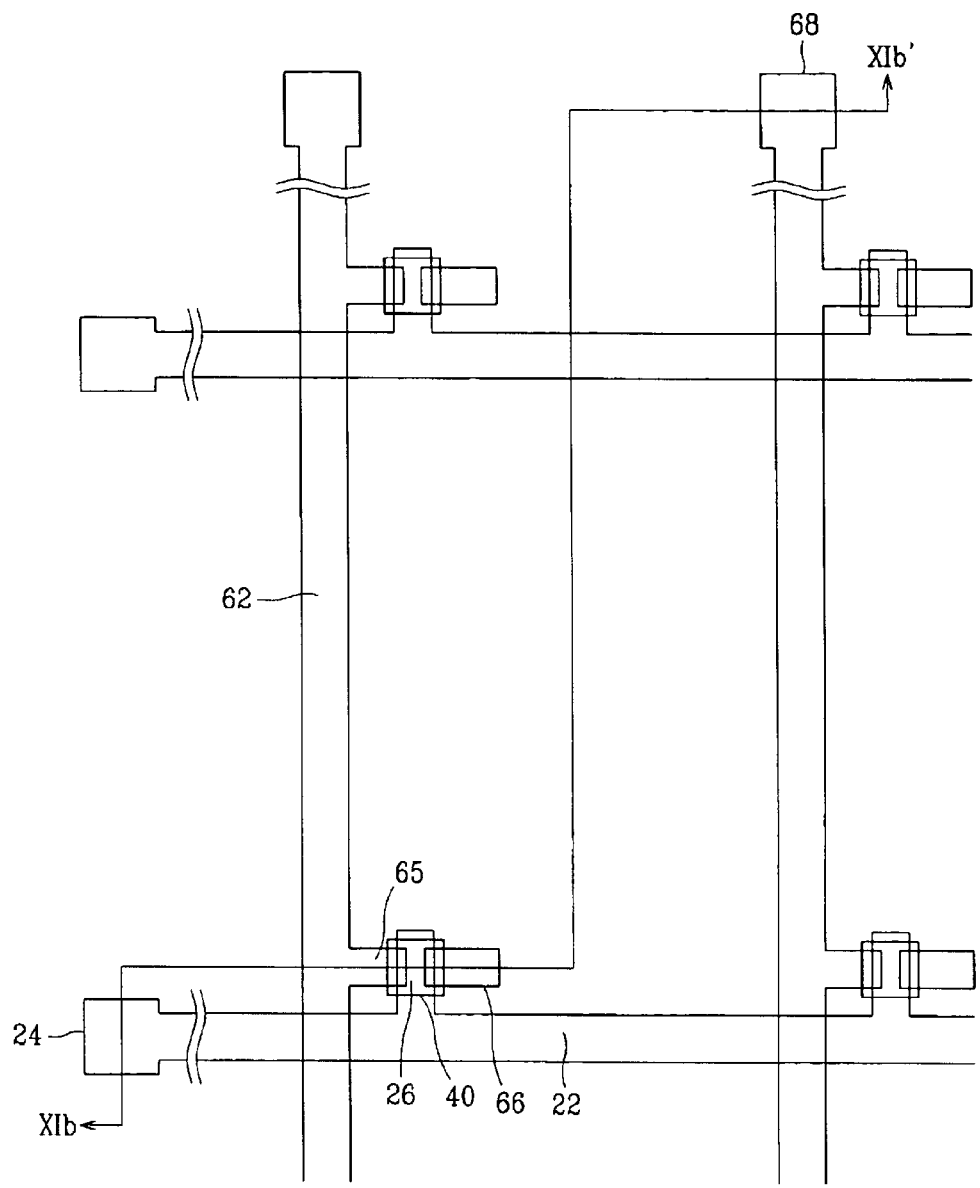
Figure 11B:
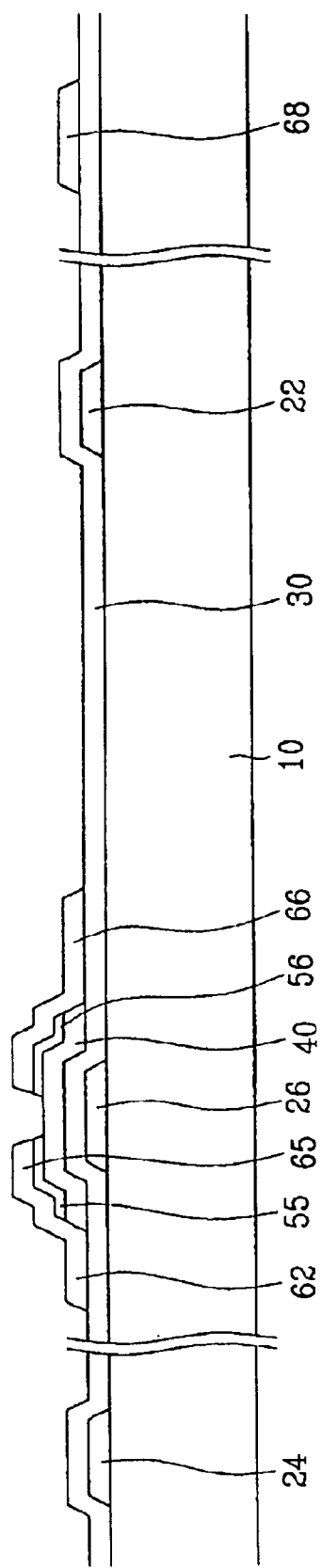
FIG. 11B is a sectional view of the TFT array panel shown in FIG. 11A taken along the line XIB–XIB'.

As shown in FIGS. 11A and 11B, a conductive layer for a data wire is deposited and patterned through photolithography based on a mask to thereby form a data wire. The data wire includes a plurality of data lines 62 intersecting the gate lines 22, a plurality of source electrodes 65 connected to the data lines 62 and extending over the gate electrodes 62, a plurality of data pads 68 connected to one ends of the data lines 62, and a plurality of drain electrodes 66 separated from the source electrodes 65 and opposite the source electrodes 65 with respect to the gate electrodes 26.

Portions of the doped amorphous silicon layer 50, which are not covered by the data wire 62, 65, 66 and 67, are etched so that the doped amorphous silicon layer 50 is divided into two opposite portions 55 and 56 with respect to the gate electrode 26 while exposing portions of the underlying semiconductor layer 40 located therebetween. In order to stabilize the exposed semiconductor layer 40, it may suffer oxygen plasma treatment.

Figure 12A:
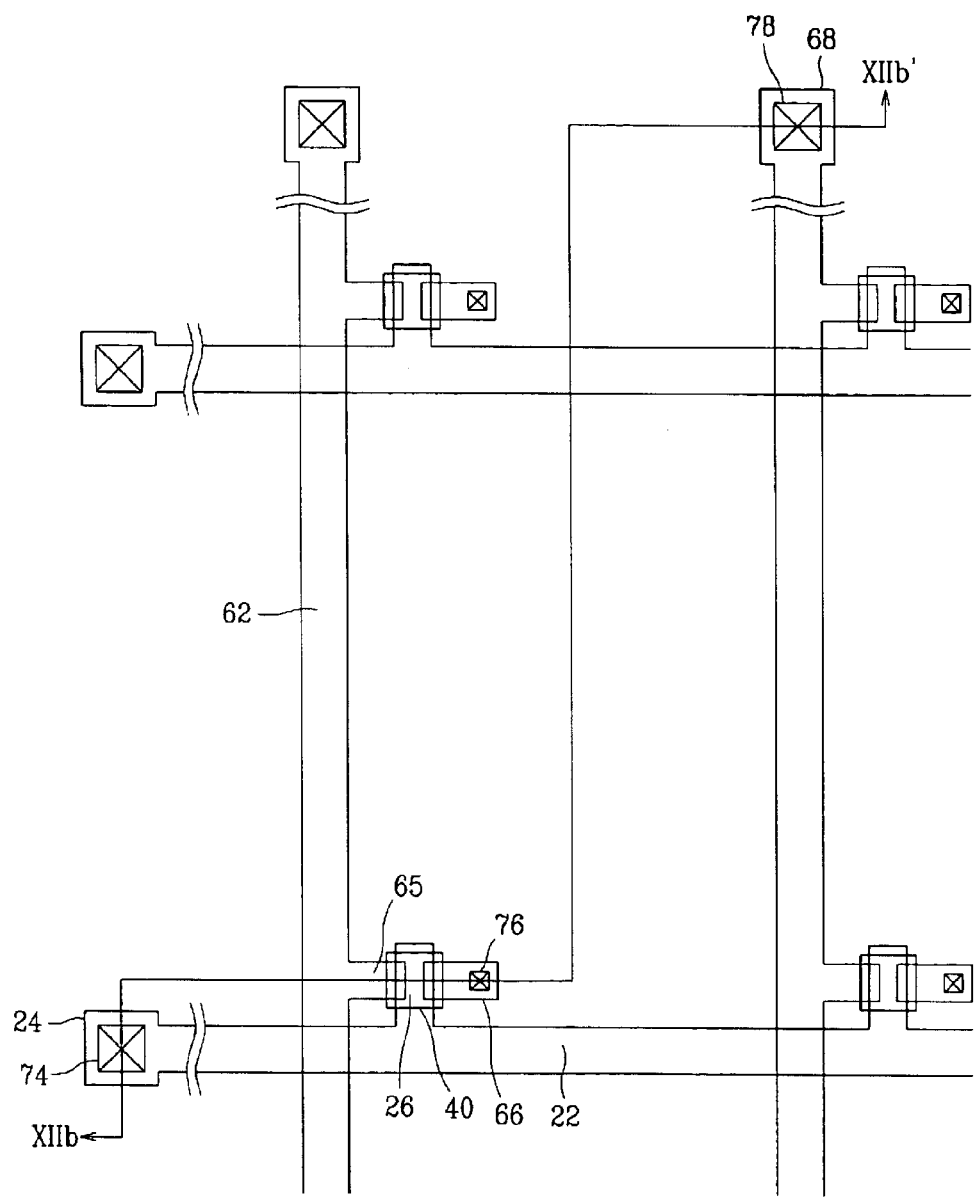
Figure 12B:
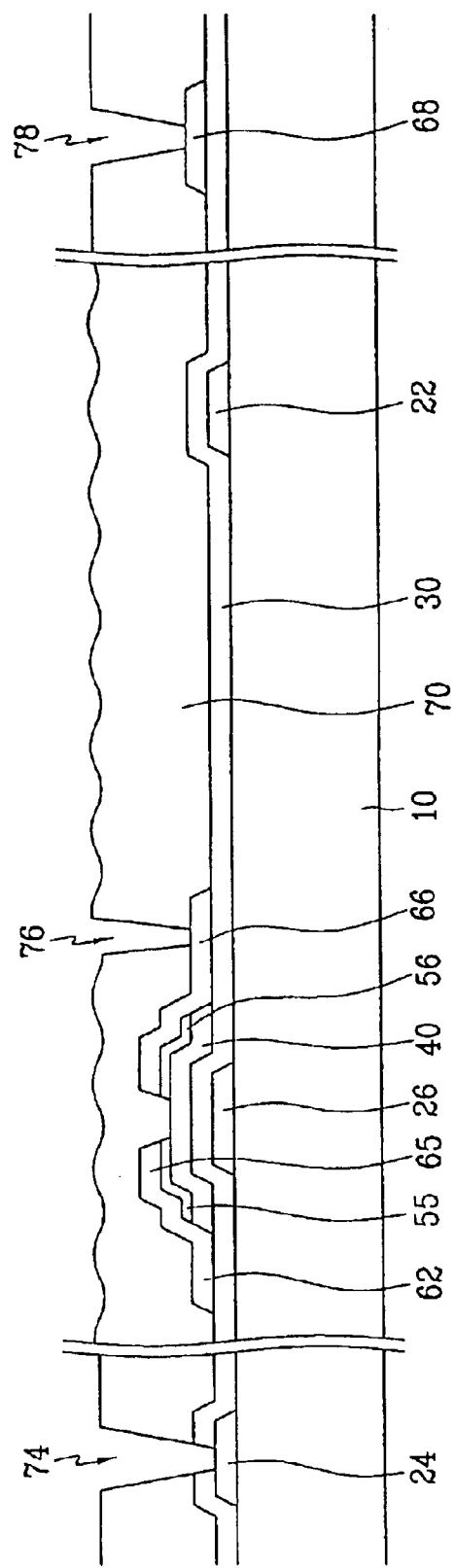
FIG. 12B is a sectional view of the TFT array panel shown in FIG. 12A taken along the line XIIB–XIIB'.

As shown in FIGS. 12A and 12B, a photosensitive organic material exhibiting excellent flattening characteristic is coated on the substrate 10 to thereby form a protective layer 70. The protective layer 70 is patterned together with the gate insulating layer 30 through photolithography based on a mask to thereby form a plurality of contact holes 74, 76 and 78 respectively exposing the gate pads 24, the drain electrodes 66 and the data pads 68 while forming an unevenness pattern on the protective layer 70.

As shown in FIGS. 7 and 8, a layer made of silver or silver alloy with the thickness of 1,000–3,000 Å, preferably about 1,500 Å, is deposited on the substrate 10 and patterned through photolithography based on a mask to thereby form a plurality of reflecting layer 82, and a plurality of subsidiary gate and data pads 86 and 88. The reflecting layers 82 are connected to the drain electrodes 66 through the contact holes 76. The subsidiary gate and data pads 86 and 88 are connected to the gate and the data pads 24 and 68 through the contact holes 74 and 78, respectively. The patterning process, as described above, is made by way of wet etching using an etching solution containing phosphoric acid of about 10–30%, nitric acid of about 5–15%, acetic acid of about 10–30% and ethylene glycol of about 1–10%, or an etching solution containing phosphoric acid of about 40–60%, nitric acid of about 1–10%, acetic acid of about 5–15%, potassium peroxymonosulphate of about 1–5%, and ultra-pure water of the remaining percent range.

According to one experiment, a pure silver layer with the thickness of about 2,000 Å is deposited and patterned using an etching solution containing phosphoric acid of about 50%, nitric acid of about 5%, acetic acid of about 10%, and potassiumperoxysulfate of about 1–3%. The etching rate of the target layer was measured to be about 40 Å/sec, the taper angle θ to be about 70–80 degrees, the critical dimension to be about 1.2–1.4 microns, and the uniformity in the critical dimension to be about 3–4%, and no residue was left over.

According to other experiment, a silver alloy layer of Ag—Pd—Cu with the thickness of about 1,500 Å was deposited and patterned through wet etching for 30–90 seconds at room temperature, using an etching solution containing phosphoric acid, nitric acid, acetic acid and ethylene glycol. The resulting TFT array panel was to be used in a 2.04" or 3.5" reflective mode LCD, and the substrate size was established to be 300 mm×400 mm. The etching rate was measured to be about 15–20 Å/sec, the taper angle θ to be about 30–80 degrees, the critical dimension (d) to be about 0.1–0.5 microns, and the uniformity in the critical dimension to be about 14%, and no residue was left over.

The reflecting layer 82 of silver or silver alloy having the thickness of 300–600 Å has both reflectance and transmissivity, and hence, can be well adapted for a transflective LCD displaying images both in a reflective mode and in a transmissive mode.

In a method of fabricating a TFT array panel for an LCD, a bar-shaped thin film or a thin film with crisscross-shaped space is formed on a substrate 10 for measuring the critical dimension, using an etching solution containing acetic acid, nitric acid, phosphoric acid and ethylene glycol. This will be now described in detail with reference to the figures.

Figure 13:
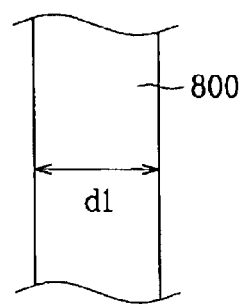
FIGS. 13 and 14 are plan views of thin films used for measuring the critical dimension in a method of fabricating a TFT array panel according to an embodiment of the present invention.
Figure 14:
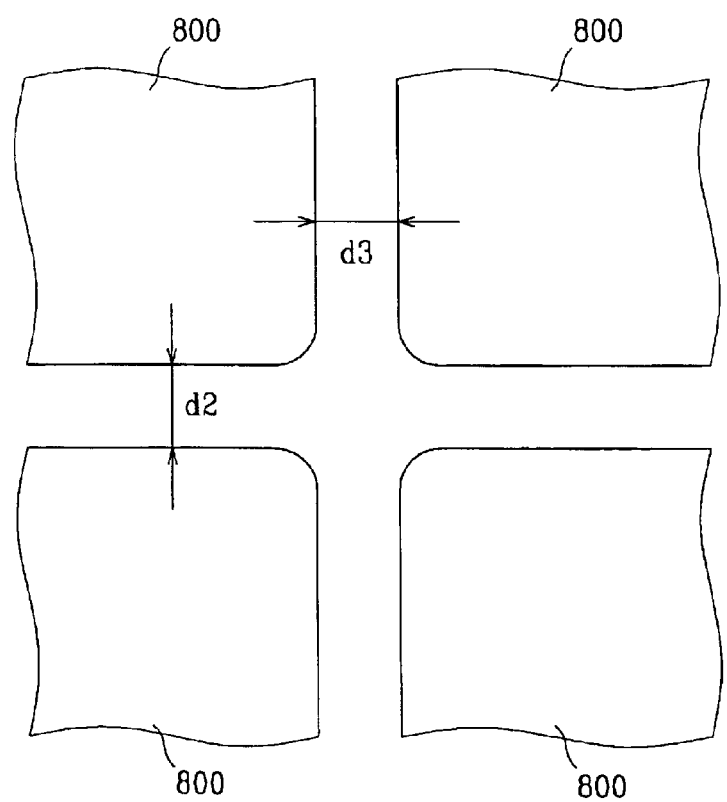
Figures 15, 16:
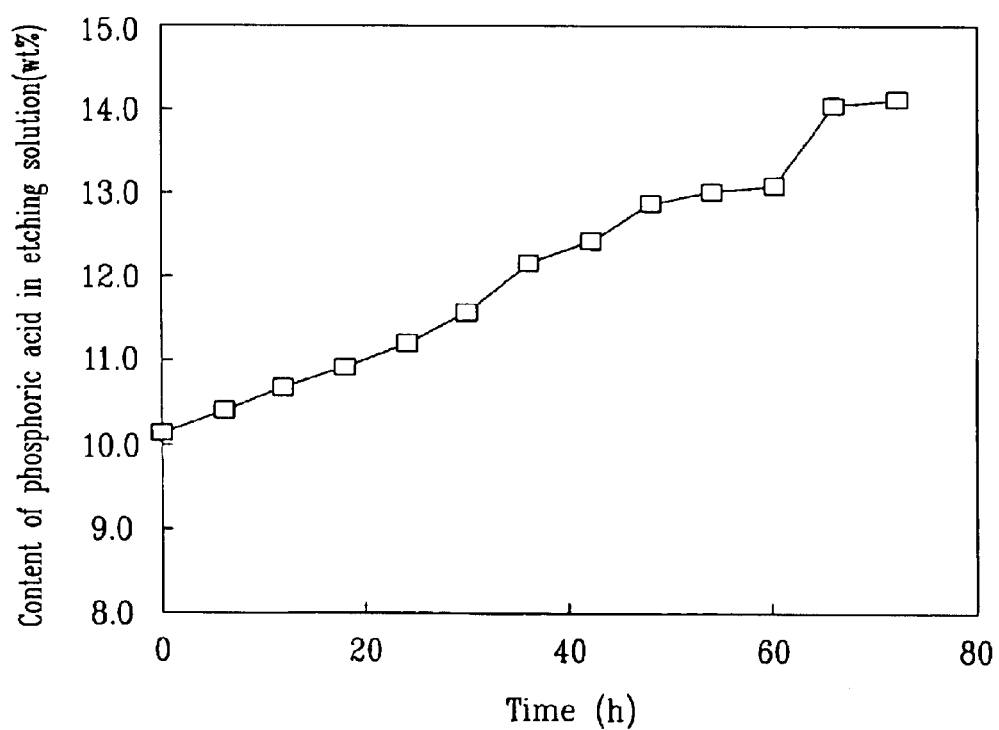
FIG. 15 is a table illustrating the measurement results of the critical dimension in the method of fabricating the TFT array panel according to an embodiment of the present invention.
FIGS. 16 to 18 are graphs illustrating the variation in the content of phosphoric acid, nitric acid and acetic acid as a function of time in the method of fabricating the TFT array panel according to an embodiment of the present invention.

FIGS. 13 and 14 are plan views of thin films formed for measuring the critical dimension in a method of a TFT array panel according to an embodiment of the present invention, and FIG. 15 is a table illustrating the measurement results of the critical dimension in a method of a TFT array panel according to an embodiment of the present invention. The measurement was made at the positions shown in FIG. 5.

As shown in FIG. 13, a thin film 800 was formed in the shape of a bar, and the width d1 thereof was measured. As shown in FIG. 14, thin films 800 were formed while making a crisscross-shaped interfacial area. The distances d2 and d3 of the neighboring thin films 800 in the horizontal and the vertical directions were measured.

As shown in FIG. 15, the width d1 of the thin film 800 was measured to be in the favorable range of 8.5–9.5 microns.

The distances d2 and d3 between the neighboring thin films 800 in the horizontal and the vertical directions were measured to be in the favorable range of 4.5–5.5 microns.

The variation in the compositions of the etching solution as a function of time in a method of fabricating a TFT array panel according to an embodiment of the present invention will be now explained in detail.

Figure 17:
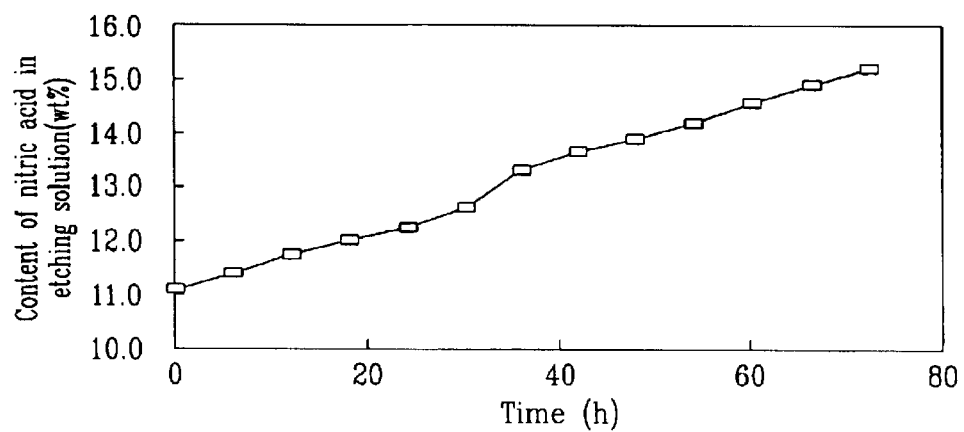
Figure 18:
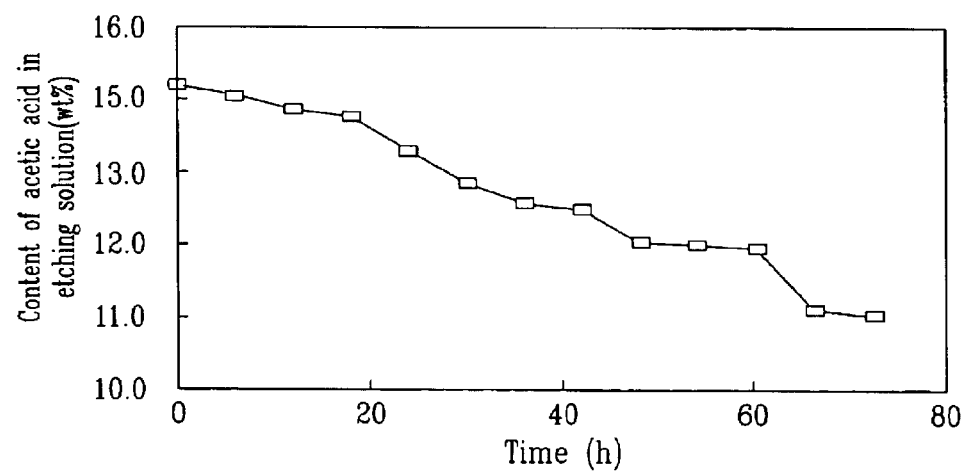

FIGS. 16 to 18 are graphs illustrating the variation in the content of phosphoric acid, nitric acid and acetic acid as a function of time in a method of fabricating a TFT array panel according to an embodiment of the present invention. In the experiments, a Ag—Pd—Cu layer with the thickness of 1,500 Å was used.

As shown in FIGS. 16 to 18, the content of phosphoric acid and nitric acid is increased as time passes by, whereas the content of acetic acid is decreased.

The reflectance and the resistance of the reflecting layer made of silver or silver alloy will be now explained in detail with reference to the drawings.

Figure 19:
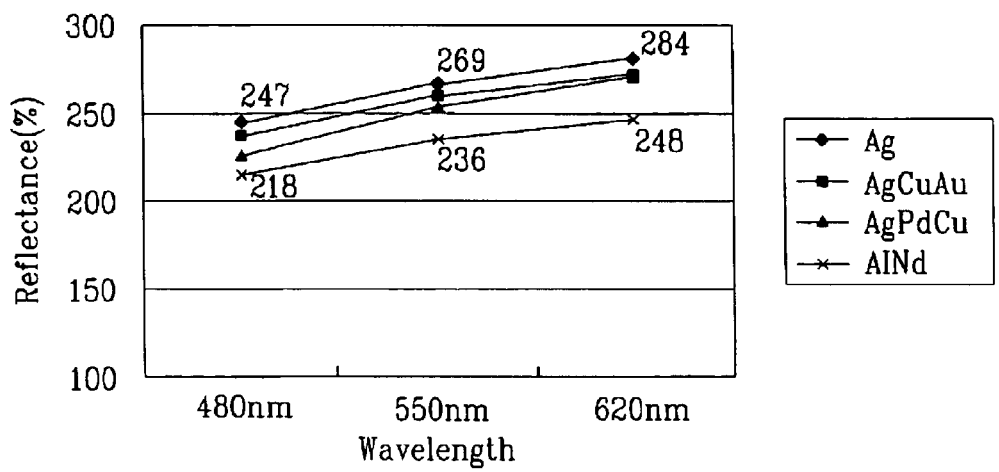
FIG. 19 is a graph illustrating the reflectance as a function of the wavelength for Al—Nd, Ag, Ag—Cu—Au and Ag—Pd—Cu.
Figure 20:
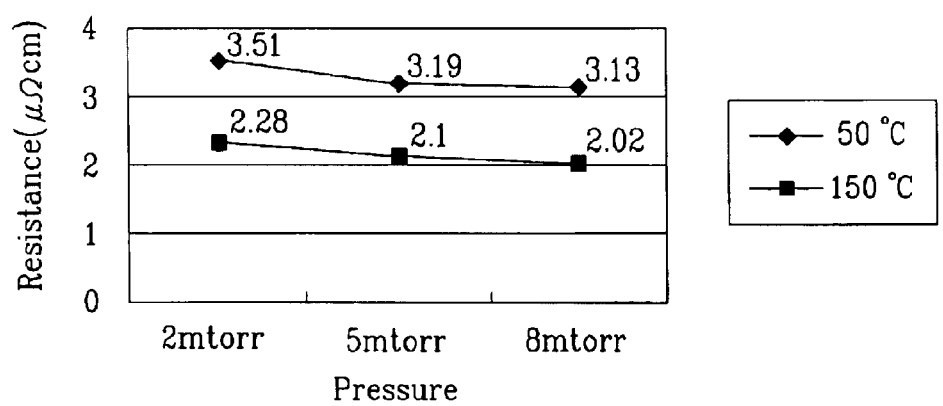
FIG. 20 is a graph illustrating the resistance as a function of the sputtering pressure for Ag—Pd—Cu.

FIG. 19 is a graph illustrating the reflectance of Al—Nd, Ag, Ag—Cu—Au and Ag—Pd—Cu as a function of the wavelength. The reflectance data in FIG. 19 is given relative to reflectance of a silicon wafer. FIG. 20 is a graph illustrating the resistance as a function of the sputtering pressure for Ag—Pd—Cu. In FIG. 20, 50° C. and 150° C. means the deposition temperatures.

FIG. 19 is a graph illustrating the reflectance of Al—Nd, Ag, Ag—Cu—Au and Ag—Pd—Cu as a function of the wavelength. The reflectance data in FIG. 19 is given relative to reflectance of a silicon wafer. FIG. 20 is a graph illustrating the resistance as a function of the sputtering pressure for Ag—Pd—Cu. In FIG. 20, 50° C. and 150° C. means the deposition temperatures.

As shown in FIG. 19, the reflectance of the silver or silver alloy reflecting layer turned out to be 15% higher than that of the aluminum alloy reflecting layer.

Furthermore, as shown in FIG. 20, the resistance of Ag—Pd—Cu was measured to be 2.02–3.51 $\mu\Omega$cm, and to be higher at 50° C. than at 150° C. Compared with the aluminum alloy reflecting layer with a resistivity of 5 $\mu\Omega$cm, the silver alloy reflecting layer turned out to bear an average resistance of 2.5 $\mu\Omega$cm, which is 50% of the aluminum alloy.

As described above, a silver or silver alloy conductive layer is patterned using an etching solution containing phosphoric acid, nitric acid, acetic acid, potassium peroxymonosulphate and ultra-pure water, or an etching solution containing phosphoric acid, nitric acid, acetic acid and ethylene glycol. Consequently, a thin film having the excellent etching rate, taper angle and uniformity is obtained, and this results in a reflecting layer with a low resistivity and a high reflectance.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of forming a signal wire, the method comprising:
   depositing a conductive layer made of silver or silver alloy on a substrate; and
   patterning the conductive layer using an etching solution comprising a composition containing phosphoric acid, nitric acid, acetic acid and potassium peroxymonosulphate.

2. The method of claim 1, wherein contents of the composition containing nitric acid, acetic acid and potassium peroxymonosulphate are phosphoric acid of 40–60%, nitric acid of 1–10%, acetic acid of 5–15%, potassium peroxymonosulphate of 1–5% and ultra-pure water of the remaining percent range.

3. The method of claim 1, wherein the silver alloy comprises silver for a base material and an additional component made of one or two selected from a group consisting of Pd, Cu, Mg, Al, Li Pu, Np, Ce, Eu, Pr, Ca, La, Nb, Nd and Sm, and content of the additional component ranges 0.01–20 atomic %.

4. A method of fabricating a TFT array panel, the method comprising:
   forming a gate wire on an insulating substrate, the gate wire including a plurality of gate lines, and a plurality of gate electrodes connected to the gate lines;
   depositing a gate insulating layer;
   forming a semiconductor layer;
   forming a data wire including a plurality of data lines intersecting the gate lines, a plurality of source electrodes connected to the data lines, and a plurality of drain electrodes opposite the source electrodes with respect to the gate electrodes;
   depositing a protective layer;
   patterning the protective layer to form a plurality of first contact holes exposing the drain electrodes;
   depositing a silver and silver alloy conductive layer on the protective layer; and
   patterning the conductive layer using an etching solution comprising composition containing phosphoric acid, nitric acid, acetic acid, potassium peroxymonosulphate, and ultra-pure water to form a reflecting layer connected to the drain electrodes through the first contact holes.

5. The method of claim 4, wherein contents of the composition containing nitric acid, acetic acid and potassium peroxymonosulphate are phosphoric acid of 40–60%, nitric acid of 1–10%, acetic acid of 5–15%, potassium peroxymonosulphate of 1–5% and ultra-pure water of the remaining percent range.

6. The method of claim 4, wherein the silver alloy comprises silver for a base material and an additional component made of one or two selected from a group consisting of Pd, Cu, Mg, Al, Li, Pu, Np, Ce, Eu, Pr, Ca, La, Nb, Nd and Sm, and content of the additional component ranges 0.01–20 atomic %.

7. The method of claim 1 wherein thickness of the conductive layer ranges from 1,000 Å to 3,000 Å.

8. The method of claim 4, wherein thickness of the conductive layer ranges from 300 Å and 600 Å.

9. The method of claim 4, wherein the protective layer is made of a photosensitive organic material.

10. The method of claim 4, wherein the gate wire further includes a plurality of gate pads for receiving scanning signals from an external source and transmitting the scanning signals to the gate lines, the data wire further includes a plurality of data pads for receiving image signals from an external source and transmitting the image signals to the data lines, and the protective layer has a plurality of second and third contact holes respectively exposing the data pads and the gate pads together with the gate insulating layer; and
   the method further comprising forming subsidiary gate and data pads made of the same layer as the reflecting layer, the subsidiary gate and data pads electrically connected to the data and the gate pads through the second and the third contact holes, respectively.

11. A method of forming a signal wire, comprising:

depositing a conductive layer made of silver or silver alloy on a substrate; and patterning the conductive layer using an etching solution comprising a composition containing nitric acid, acetic acid, phosphoric acid and ethylene glycol, wherein contents of the composition containing nitric acid, acetic acid, phosphoric acid and ethylene glycol are phosphoric acid of 10–30%, nitric acid of 5–15%, acetic acid of 10–30%, ethylene glycol of 1–10% and ultra-pure water of the remaining percent range.

12. A method of fabricating a TFT array panel, the method comprising:

forming a gate wire on an insulating substrate, the gate wire including a plurality of gate lines, and a plurality of gate electrodes connected to the gate lines;

depositing a gate insulating layer;

forming a semiconductor layer;

forming a data wire including a plurality of data lines intersecting the gate lines, a plurality of source electrodes connected to the data lines and close to the gate electrodes, and a plurality of drain electrodes opposite the source electrodes with respect to the gate electrodes;

depositing a protective layer;

patterning the protective layer to form a plurality of first contact holes exposing the drain electrodes;

depositing a silver and silver alloy conductive layer on the protective layer; and patterning the conductive layer using an etching solution comprising a composition containing nitric acid, acetic acid, phosphoric acid, ethylene glycol and ultra-pure water to form a reflecting layer connected to the drain electrodes through the first contact boles, wherein contents of the composition containing nitric acid, acetic acid, phosphoric acid and ethylene glycol are phosphoric acid of 10–30%, nitric acid of 5–15%, acetic acid of 10–30%, ethylene glycol of 1–10% and ultra-pure water of the remaining percent range.

* * * * *